(12) United States Patent
Miyata

(10) Patent No.: US 6,472,688 B2
(45) Date of Patent: Oct. 29, 2002

(54) SEMICONDUCTOR LIGHT EMITTING DEVICE AND DISPLAY DEVICE USING THE SAME

(75) Inventor: Masataka Miyata, Yamatotakadai (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/795,971

(22) Filed: Mar. 1, 2001

(65) Prior Publication Data
US 2001/0020705 A1 Sep. 13, 2001

(30) Foreign Application Priority Data
Mar. 2, 2000 (JP) .......................... 2000-057100

(51) Int. Cl.[7] .................. H01L 27/15; H01L 33/00; H01L 29/74; H01L 29/861
(52) U.S. Cl. ............... 257/79; 257/99; 257/84; 257/603; 257/173
(58) Field of Search .................. 257/84, 99, 79, 257/603, 80, 89, 88, 90, 173, 528, 113, 918, 109, 111, 114

(56) References Cited

U.S. PATENT DOCUMENTS

| | | | |
|---|---|---|---|
| 5,347,147 A | * 9/1994 | Jones | 257/77 |
| 5,914,501 A | * 6/1999 | Antle et al. | 257/99 |
| 5,959,307 A | * 9/1999 | Nakamura et al. | 257/14 |
| 6,054,716 A | * 4/2000 | Sonobe et al. | 250/552 |

FOREIGN PATENT DOCUMENTS

| | | | |
|---|---|---|---|
| DE | 3030058 | * 3/1982 | |
| JP | 2000077722 A | * 8/1998 | |
| JP | 11-040848 | 2/1999 | |
| JP | 11-112026 | 4/1999 | |
| JP | Pub 2000231363 A | * 8/2000 | |

* cited by examiner

*Primary Examiner*—Eddie Lee
*Assistant Examiner*—Joseph Nguyen
(74) *Attorney, Agent, or Firm*—Nixon & Vanderhye P.C.

(57) ABSTRACT

A semiconductor light emitting device has a blue LED and a green LED which each have a protection circuit connected in parallel thereto. The protection circuit has two Zener diodes that are connected in series in opposite directions to each other. When an AC voltage below a breakdown voltage of the protection circuit is applied to the semiconductor light emitting device and when the voltage is in forward direction, a current passes through the blue and green LEDs to emit lights. A current is intercepted by the protection circuit when the voltage is in reverse direction. When an high AC voltage above a breakdown voltage of the protection circuit is applied, a current passes through the protection circuit whether the current in forward direction or in reverse direction, so that the green and blue LEDs are protected. Even when the semiconductor light emitting devices are connected to one another in a matrix form and subject to dynamic driving, a leakage current is intercepted by the protection circuits. The semiconductor light emitting device has a red LED which is connected in series to voltage compensating diodes. The voltage compensating diodes increase an apparent forward direction threshold voltage of the red LED to compensate difference in forward direction threshold voltages among the blue, green and red LEDs.

26 Claims, 9 Drawing Sheets

SEMICONDUCTOR LIGHT EMITTING DEVICE AND DISPLAY DEVICE USING THE SAME

BACKGROUND OF THE INVENTION

The present invention relates to a semiconductor light emitting device having a LED (light-emitting diode), and a display device using the same.

A conventional semiconductor light emitting device is shown in FIG. 10. In this semiconductor light emitting device 100, a LED chip 101 is placed on the top of a first lead 102, and one electrode of the LED chip 101 is electrically connected to the first lead 102. The other electrode of the LED chip 101 is electrically connected to a second lead 104 via a gold wire 103. The LED chip 101 and top portions of the first and second leads 102, 104 are sealed with resin 105 which is transparent to a light from the LED chip 101. The LED chip 101 is structured, though not illustrated, to incorporate p-n junction formed by direct joining of a p-type layer and a n-type layer, or double hetero-junction formed by insertion of an active layer between the p-type layer and the n-type layer. The p-n junction portion or the active layer emits light when a forward direction voltage is applied between the p-type layer and the n-type layer.

When an AC voltage is applied to the semiconductor light emitting device 100, a current passes through the LED chip 101 only when the voltage is in forward direction because of rectification of the LED chip.

However, the semiconductor light emitting device 100 has a weakness for a reverse direction voltage, so that the LED chip 101 breaks if reverse direction voltage is excessively generated in AC driving. In the process of handling a substrate of the LED chip, the LED chip 101 also breaks if applied a static electric voltage in reverse direction.

In order to overcome this weakness, a semiconductor light emitting device as shown in FIG. 11 has been proposed. The semiconductor light emitting device 110 has a first lead 111, a second lead 112, a Zener diode chip 115 and a LED chip 116. The Zener diode chip 115 is die-bonded to a concave portion provided on the top of the first lead 111. The LED chip 116 has a p-side electrode and a n-side electrode formed on one surface thereof, and the LED chip 116 is facedown-bonded to the surface of the Zener diode chip 115. The Zener diode chip 115 and the LED chip 116 are parallel-connected in opposite directions to each other. These parallel-connected Zener diode chip 115 and LED chip 116 are connected to the first lead 111 and also to the second lead 112 via a gold wire 114. The Zener diode chip 115, the LED chip 116, and top portions of the first and the second leads 111, 112 are sealed with resin 117, by which the semiconductor light emitting device 110 is constituted.

When an AC voltage is applied to the semiconductor light emitting device 110 and when the voltage is in forward direction, a current passes through the LED chip 116 and the LED chip 116 emits light while the Zener diode chip 115 is in OFF state till the voltage reaches a certain level. On the other hand, when the voltage is in reverse direction, the Zener diode chip 115 is turned on so that high voltage is not applied to the LED chip 116. Accordingly, the Zener diode chip 115 prevents the LED chip 116 from breaking due to reverse voltage.

A display device 120 using the conventional semiconductor light emitting device 110 is shown in FIG. 12. The display device 120 is a dynamic driving display device, in which a plurality of leads are provided in a vertical direction and a horizontal direction. On junctions of these leads, semiconductor light emitting devices are disposed in the form of matrix and connected. The semiconductor light emitting devices are made up of LEDij and Zener diode Zij (i=1 to 3, j=1 to 3). A transistor TRk (k=1 to 6) is provided to each one end of the leads. Those transistors TRk are each controlled so as to light a desired semiconductor light emitting device LEDij, by which images are displayed on the display device 120.

It is noted that the display device 120 is a full color semiconductor light emitting device having red LEDi1 (i=1 to 3), green LEDi2 (i=1 to 3), and blue LEDi3 (i=1 to 3), where the forward direction threshold voltage of the red LEDi1 (i=1 to 3) is 2.1V, and the forward direction threshold voltage of the green LEDi2 (i=1 to 3) and the blue LEDi3 (i=1 to 3) is 3.5V.

However, the display device 120 has a drawback that when transistors TR2 and TR5 are turned on to light LED22, a leakage current is passed through Zener diode Z11, as a result of which not only LED 22 but also LED21 and LED12 are slightly lit up, as shown with an arrow A.

Further, because the forward direction threshold voltage of the red LEDi1 is 2.1V, when the display device 120 is driven at 3.5V or more corresponding to the forward direction threshold voltage of green LEDi2 (i=1 to 3) and blue LEDi3 (i=1 to 3), red LEDi1 (i=1 to 3) suffers from high remaining voltage in its driver IC (integrated circuit). This imposes a load on the constant current driver IC of the red LEDi1 (i=1 to 3) and raises temperature thereof, causing lower reliability of the driver IC and lower reliability of the display device 120 as well.

SUMMARY OF THE INVENTION

Accordingly, a first object of the present invention is to provide a semiconductor light emitting device which is not damaged by a reverse direction voltage at the time of AC driving and free from malfunction due to a leakage current caused by matrix connection.

A second object of the present invention is to provide a highly-reliable semiconductor light emitting device in which when LEDs with different forward direction threshold voltages are connected in parallel so that a large load is not imposed on a constant current driver IC driving a specified LED and therefore the specified constant current driver IC is free from temperature rise.

In order to accomplish the above objects, the present invention provides a semiconductor light emitting device comprising a LED and a protection circuit made up of Zener diodes connected in series in opposite directions to each other, wherein the LED and the protection circuit are connected in parallel.

According to the semiconductor light emitting device of this invention, when a forward direction voltage below the breakdown voltage of the protection circuit is applied to the LED, the reverse-direction Zener diode in the protection circuit is turned off and so the current is not passed through the protection circuit, while on the contrary, the current is passed through the LED and the LED emits light. On the other hand, when a reverse direction voltage below the breakdown voltage of the protection circuit is applied to the LED, the forward direction Zener diode in the protection circuit is turned off and so the current is not passed through the protection circuit, while at the same time, the LED is turned off and therefore the current is not passed through the LED either.

When a forward direction voltage above the breakdown voltage of the protection circuit is applied to the LED, the reverse direction Zener diode in the protection circuit breaks down and so the current is passed through the protection circuit. When a reverse direction voltage above the breakdown voltage of the protection circuit is applied to the LED, the forward direction Zener diode in the protection circuit breaks down and so the current is also passed through the protection circuit. In other words, it can be said that when a voltage above the breakdown voltage of the protection circuit is applied in either forward or reverse direction to the semiconductor light emitting device, the current is allowed to pass through the protection circuit in the direction of applied voltage, which prevents a high voltage applied to the LED, and as a result the LED is protected from damage or breakage. It is noted that in the protection circuit, a total voltage obtained by adding a Zener voltage of the reverse direction Zener diode and a forward direction threshold voltage of the forward direction Zener diode is set to be larger than an operational voltage of the LED.

According to one embodiment of the present invention, the LED is made from a nitride compound semiconductor.

According to this embodiment, the LED made from the nitride compound semiconductor is higher in operational voltage than other LEDs made from, for example, AlGaInP (Aluminum gallium indium phosphorous). Accordingly, when the semiconductor light emitting device is driven with AC, there is possibility that a reverse-direction voltage is excessively applied. However, even though such excessive reverse-direction voltage is applied, the protection circuit breaks down and let the current pass through the protection circuit, by which the LED made from a nitride compound semiconductor can be protected from high voltage applied in reverse direction.

In one embodiment of the present invention, the protection circuit is formed in one silicon chip.

According to this embodiment, the protection circuit made up of a plurality of the Zener diodes is formed in one silicon chip, which makes it possible to down-size the semiconductor light emitting device.

In one embodiment of the present invention, at least one LED is disposed on the silicon chip.

According to this embodiment, the LED is disposed on the silicon chip in which the protection circuit is formed. Therefore, it is possible to down-size the semiconductor light emitting device since at least one LED is disposed on the silicon chip.

The present invention also provides a semiconductor light emitting device in which plural kinds of LEDs different in forward direction threshold voltages, comprising: at least one voltage compensating diode which is connected in series to the LED having a lower forward direction threshold voltage.

According to the semiconductor light emitting device of the present invention, in the case where a plural kinds of LEDs having different forward direction threshold voltages are connected in parallel and driven at a constant voltage, a voltage compensating diode is connected in series to the LED having a lower forward direction threshold voltage so as to compensate for difference in threshold voltage among the LEDs. As a result, the apparent forward direction threshold voltage of the LED with lower forward direction threshold voltage becomes approximately equal to the forward direction threshold voltage of the LED with higher forward direction threshold voltage. Therefore, the remaining voltage of the driver IC in the LED having a lower forward direction threshold voltage becomes approximately equal to that in the LED having a higher forward direction threshold voltage as well. This decreases a load on the constant current driver IC for driving the semiconductor light emitting device and therefore implements stable performance of the semiconductor light emitting device.

In one embodiment of the present invention, the voltage compensating diode is formed in one silicon chip.

According to this embodiment, it is possible to down-size the semiconductor light emitting device since the voltage compensating diode is formed in one silicon chip.

In one embodiment of the present invention, the LED is connected in parallel to one other LED having a forward direction threshold voltage different from that of the LED; and at least one voltage compensating diode is connected in series to either one of the LED and the other LED which one has a lower forward direction threshold voltage.

According to this embodiment, a LED having a protection circuit is connected in parallel to one other LED having a forward direction threshold voltage different from that of the LED, and at least one voltage compensating diode is connected in series to a LED having a lower threshold voltage from among the LEDs so that the voltage compensating diode compensates difference in threshold voltage between the LEDs. Consequently, when a plurality of the LEDs having different forward direction threshold voltages are driven at a constant voltage, the LED having the lower forward direction threshold voltage no longer suffers from a high remaining voltage in the driver IC. Therefore, no load is imposed on the constant current driver IC of the semiconductor light emitting device. Thus, performance of the semiconductor light emitting device is stabilized.

The present invention further provides a semiconductor light emitting device, comprising: a first LED emitting at least one of blue light and green light; a is protection circuit made up of Zener diodes connected in series in opposite directions to each other; and a red light emitting circuit made up of a second LED emitting a red light and at least one voltage compensating diode connected in series to the second LED, wherein the first LED, the protection circuit and the red light emitting circuit are connected in parallel.

According to this present invention, the first LED is higher in forward direction threshold voltage than the second LED when the first LED is made from, for example, a nitride compound semiconductor for emitting blue light or red light and the second LED is made from, for example, AlGaInP for emitting a red light. Therefore, the voltage compensating diode is connected in series to the second LED so as to compensate for difference in forward direction threshold voltages between the first LED and the second LED. Accordingly, even when the semiconductor light emitting device is driven at a voltage corresponding to the threshold voltage of the first LED, the second LED no longer suffers from the increased remaining voltage in the driver IC. Therefore, no load is imposed on the constant current driver IC of the semiconductor light emitting device. This stabilizes performance of the semiconductor light emitting device.

In addition, the semiconductor light emitting device has a protection circuit. Therefore, when an AC voltage below the breakdown voltage of the protection circuit is applied to the semiconductor light emitting device, a forward current passes through the first LED and the second LED to emit lights, and a reverse current does not passe through the semiconductor light emitting device. Further, even when an AC voltage above the breakdown voltage of the protection circuit is applied to the semiconductor light emitting device, whether in forward direction or reverse direction, a current is allowed to pass through the protection circuit. Thereby, the first LED and the second LED are protected. This stabilizes performance of the semiconductor light emitting device and makes the LEDs proof against damage or breakage.

In one embodiment of the present invention, the voltage compensating diode and the protection circuit are formed in one silicon chip.

According to this embodiment, it is possible to down-size the semiconductor light emitting device since the voltage compensating diode and the protection circuit are formed in one silicon chip.

In one embodiment of the present invention, the Zener diodes are connected in an anode common state or a cathode common state.

According to this embodiment, the LED to be connected to the protection circuit need not have a limited polarity.

In one embodiment of the present invention, a dynamic driving display device uses the above-stated semiconductor light emitting device.

According to this embodiment, the dynamic driving display device includes the semiconductor light emitting device having the protection circuit provided with a forward direction Zener diode. Therefore, the forward direction Zener diode intercepts a leakage current in reverse direction. As a result, the display device is free from indication errors. Further, the voltage compensating diode compensates a shortage of the forward direction threshold voltage in the LED. As a result, the forward direction threshold voltage of the LED becomes apparently equal to the higher forward direction threshold voltage of the other LED. Therefore, this prevents a remaining voltage in the driver IC of the semiconductor light emitting device from being increased, and stabilizes performance of the display device as well as performance of the semiconductor light emitting device.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, embodiments of the present invention are described in detail with reference to the accompanying drawings.

Figure 1:
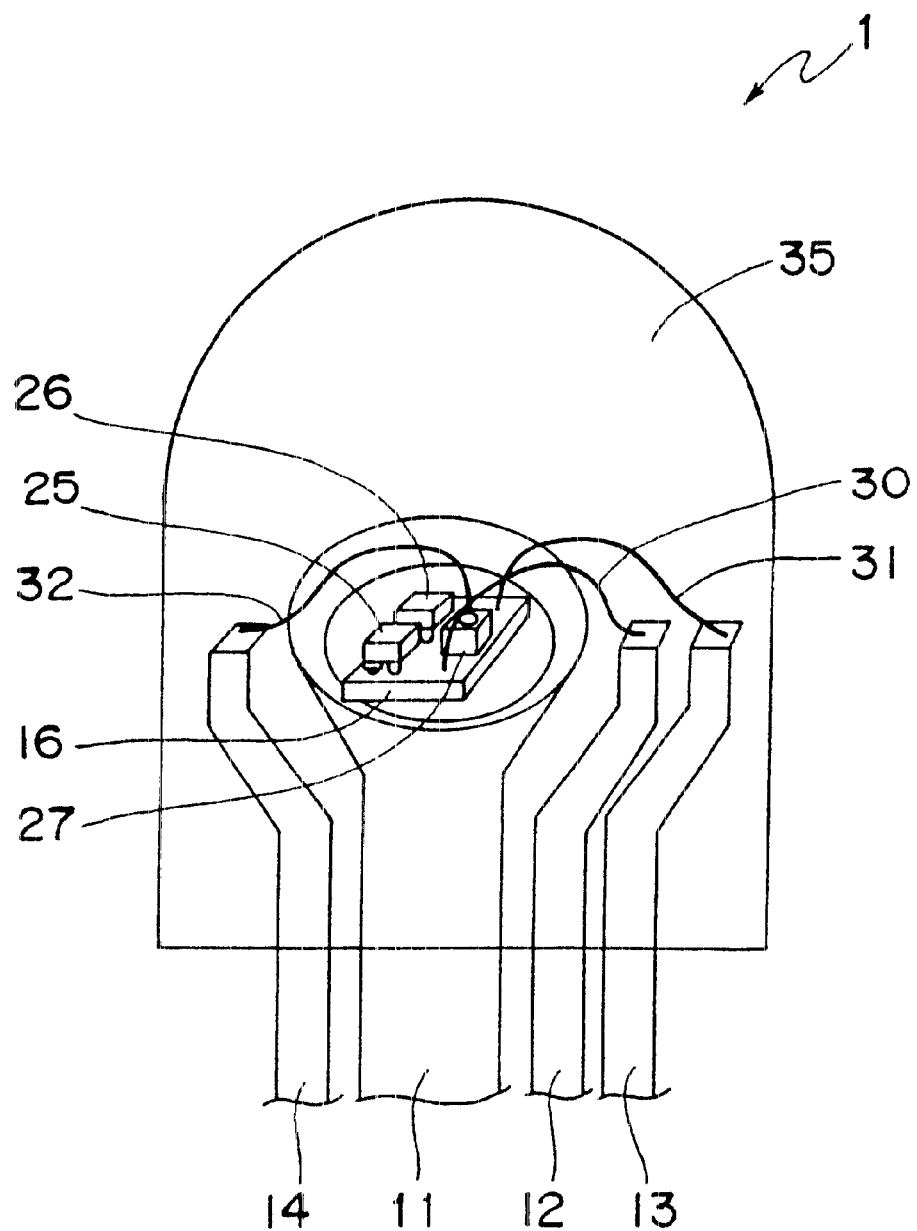
FIG. 1 is a perspective view of a semiconductor light emitting device according to the present invention.

FIG. 1 is a perspective view of a semiconductor light emitting device 1 according to the present invention.

The semiconductor light emitting device 1 has a first lead 11, a second lead 12, a third lead 13 and a fourth lead 14, all of which are formed on a lead frame. A silicon chip 16 is mounted on a concave portion provided on a top of the first lead 11. A green LED chip 25 and a blue LED chip 26 made from nitride compound semiconductors are bonded to the upper surface of the silicon chip 16 with bumps. Also, a red LED chip 27 made from AlGaInP is die-bonded thereto with an Ag paste.

Figure 2:
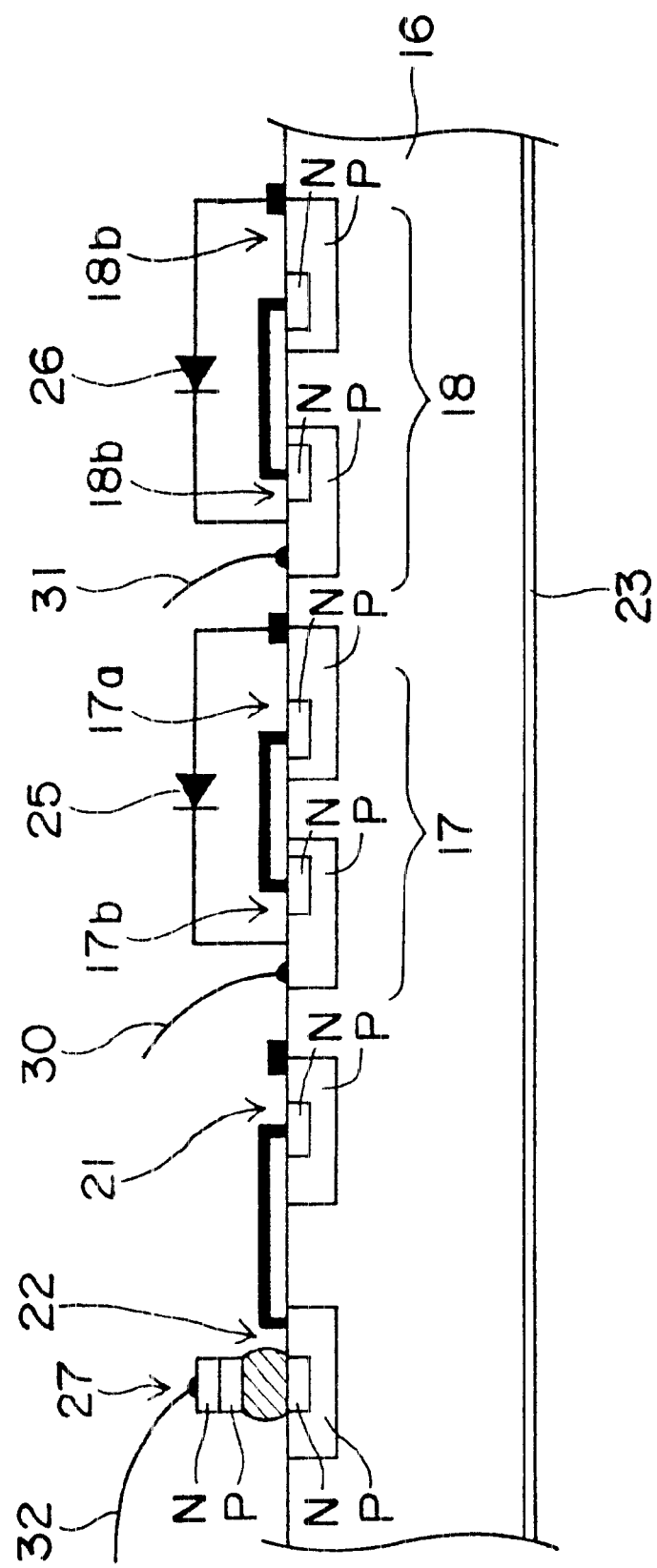
FIG. 2 is a sectional view of a silicon chip incorporated in the semiconductor light emitting device shown in FIG. 1.

FIG. 2 is a sectional view of the silicon chip 16. The silicon chip 16 incorporates two protection circuits 17 and 18, in which forward direction Zener diodes 17a and 18a are connected in series to reverse direction Zener diodes 17b and 18b, respectively. The silicon chip 16 further incorporates two voltage compensating diodes 21 and 22 which are connected in series in the same direction to each other. On the lower surface of the silicon chip 16, there is provided a p-electrode 23 which is bonded to the first lead 11 with an Ag (silver) paste.

The green LED chip 25 is connected in parallel to the protection circuit 17. A p-side electrode of the reverse direction Zener diode 17b incorporated in the protection circuit 17 is connected to the second lead 12 via a gold lead 30. The blue LED chip 26 is connected in parallel to the protection circuit 18. A p-side electrode of the reverse direction Zener diode 18b incorporated in the protection circuit 18 is connected to the third lead 13 via a gold lead 31. On the other hand, the red LED chip 27 is connected in series to the voltage compensating diodes 21 and 22. A p-side electrode of the red LED chip 27 is connected to a n-side electrode of the voltage compensating diode 22 with an Ag paste, whereas a n-side electrode of the red LED chip 27 is connected to the fourth lead 14 via a gold lead 32.

As shown in FIG. 1, the silicon chip 16, the green LED chip 25, the blue LED chip 26, and the red LED chip 27 mounted on the top of the first lead, as well as a top portion of the second lead, a top portion of the third lead, and a top portion of the fourth lead are sealed with clear dome-shaped resin 35, to form the lamp-shaped semiconductor light emitting device 1.

Figure 3:
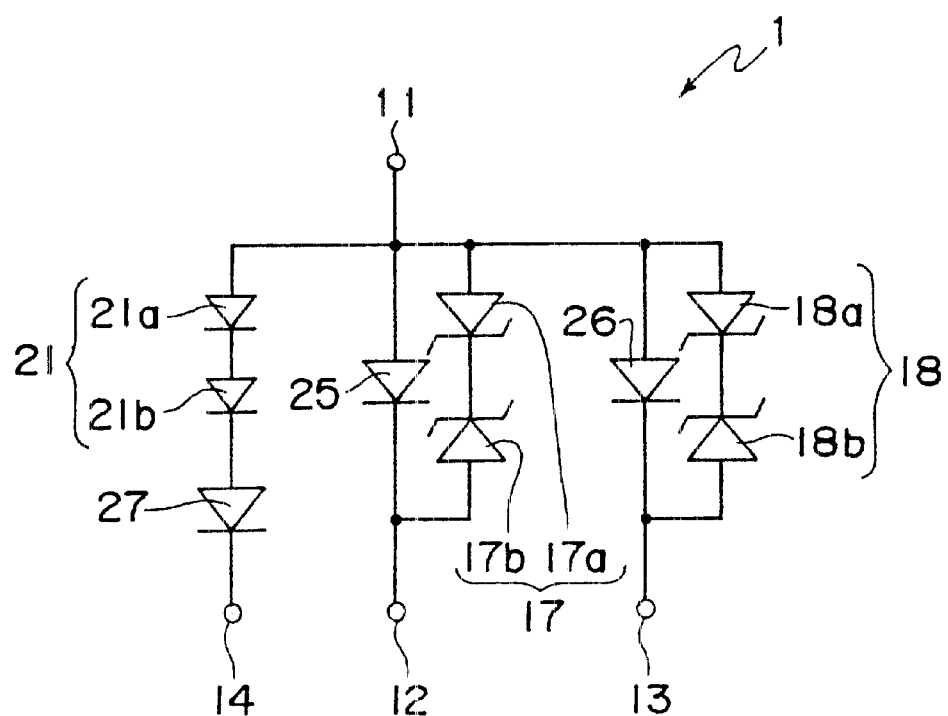
FIG. 3 is a circuit diagram of the semiconductor light emitting device shown in FIG. 1.

With reference to a circuit diagram shown in FIG. 3, description will be made of the behavior of the semiconductor light emitting device 1. In FIG. 3, the same reference numerals are used for the same component members that FIG. 1 or 2 shows.

The protection circuits 17 and 18 have a breakdown voltage obtained by adding up a forward direction threshold voltage of the forward direction Zener diodes 17a and 18a and a Zener voltage of the reverse direction Zener diodes 17b and 18b, respectively. The breakdown voltage is set to be larger than the operational voltage of the green LED chip 25 and the blue LED chip 26. It is noted that the same kind of Zener diodes are used in the forward direction Zener diodes 17a and 18a and the reverse direction Zener diodes 17b and 18b, respectively. Therefore, the forward direction breakdown voltage is equal to the reverse direction breakdown voltage in the protection circuits 17 and 18.

When an AC voltage below the breakdown voltage of the protection circuit is applied between the first lead 11 and the second lead 12, and when the voltage is in forward direction, the current is passed through the green LED chip 25. Thereby, the green LED chip 25 emits light. When the voltage is in reverse direction, the current is not allowed to pass trough the green LED chip 25, and at the same time the current is not allowed to pass through the protection circuit 17 either, because of the forward direction Zener diode 17a incorporated in the protection circuit 17. Therefore, current in the reverse direction is neither passed through the green LED chip 25 nor the protection circuit 17.

When a voltage larger than the breakdown voltage of the protection circuit 17 is applied to the green LED chip 25 and the protection circuit 17 due to presence of static electric charges or the like, and when the voltage is in forward direction, the reverse direction Zener diode 17b of the protection circuit 17 breaks down. Thereby, the current is passed through the protection circuit 17 in forward direction. When the voltage is in reverse direction, the forward direction Zener diode 17a of the protection circuit 17 breaks down, and thereby the current is passed through the protection circuit 17 in reverse direction. In other words, when a voltage larger than the breakdown voltage of the protection circuit 17 is applied, a current is allowed to pass through the protection circuit 17, by which voltage application to the green LED chip 25 is prevented, which protects the green LED chip 25 from being damaged.

In addition, parallel-connected blue LED chip 26 and protection circuit 18 have the same function as above-stated parallel-connected green LED chip 25 and protection circuit 17, respectively. That is to say, when the voltage applied to the first lead 11 and the third lead 13 is smaller than the breakdown voltage of the protection circuit 18, and when the voltage is in forward direction, the blue LED chip 26 emits light. When the voltage is in reverse direction, a reverse direction current is neither passed through the blue LED chip 26 nor the protection circuit 18. When the voltage is larger than the breakdown voltage of the protection circuit 18, a current, whether in forward direction or in reverse direction, is passed through the protection circuit 18 to protect the blue LED chip 26.

The forward direction threshold voltages of the green LED chip 25 and the blue LED chip 26 made from nitride compound semiconductors are each 3.5V while the forward direction threshold voltage of the red LED chip 27 made from AlGaInP is 2.1V. Consequently, in the case where the semiconductor light emitting device 1 is driven at 3.5V or more corresponding to the forward direction threshold voltages of the green LED chip 25 and the blue LED chip 26, since the voltage is beyond the threshold of the red LED chip 27, the red LED chip 27 suffers from increased remaining voltage in the driver IC. To overcome this drawback, an apparent forward direction threshold voltage of the red LED chip 27 is compensated by connecting two voltage compensating diodes 21 and 22 to the red LED chip 27 in series. Since the forward direction threshold voltages of the voltage compensating diodes 21 and 22 are each 0.7V, a total apparent forward direction threshold voltage of the red LED chip 27 and the voltage compensating diodes 21 and 22 equals to 3.5V. As a result, if the semiconductor light emitting device 1 is driven at 3.5V, the red LED chip 27 no longer suffers from high remaining voltage in the driver IC and therefore a large load is not imposed on the constant current driver IC (not shown) of the semiconductor light emitting device 1 by which the semiconductor light emitting device 1 implements stable performance.

In the above-stated embodiment, although the red LED chip is made from quaternary n-type AlGaInP, the red LED chip may be made from p-type GaAlAs (Gallium aluminum arsenic).

Figure 4A:
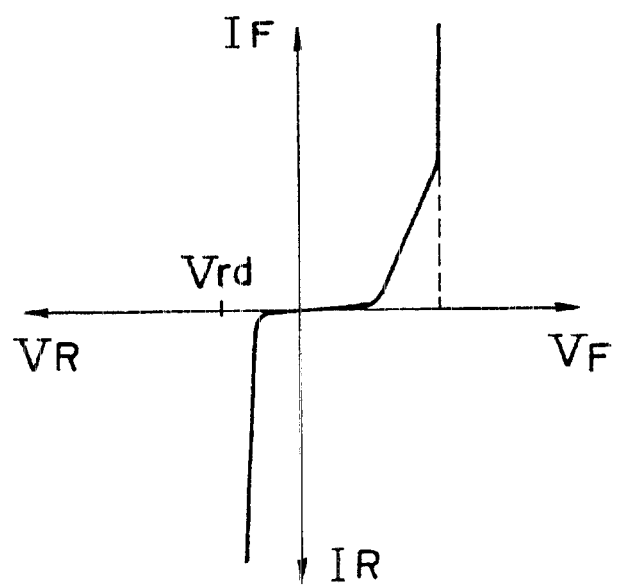
FIG. 4A is a view showing current/voltage characteristics of a conventional semiconductor light emitting device shown in FIG. 11.
Figure 4B:
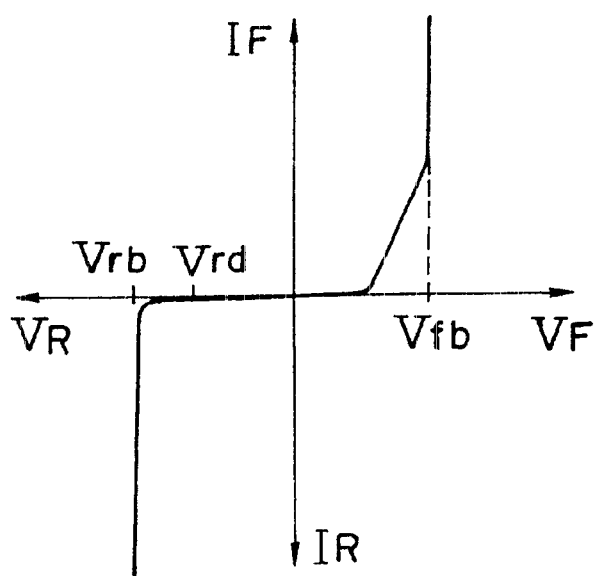
FIG. 4B is a view showing current/voltage characteristics of a green LED chip and a protection circuit incorporated in the semiconductor light emitting device of the present invention shown in FIG. 1.
Figure 11:
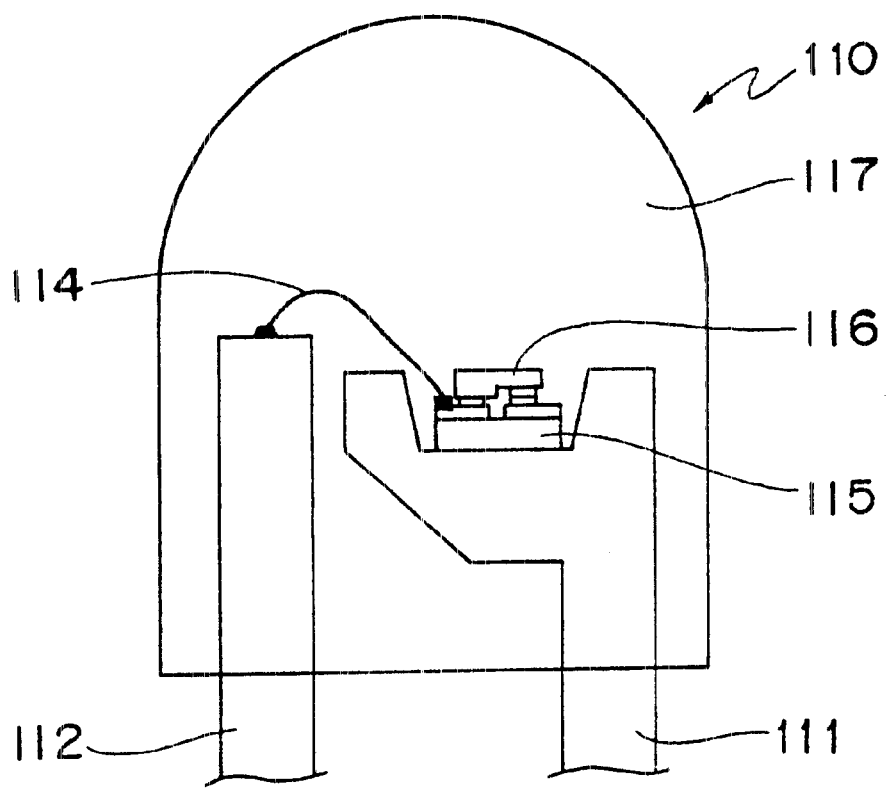
FIG. 11 is a sectional view of anther conventional semiconductor light emitting device.

FIG. 4A is a view showing current/voltage characteristics of the conventional semiconductor light emitting device 110 shown in FIG. 11. FIG. 4B is a view showing current/voltage characteristics of the green LED chip 25 and the protection circuit 17 incorporated in the semiconductor light emitting device of the present invention shown in FIGS. 1, 2, and 3. As shown in FIG. 4A, when a reverse direction voltage Vrd is applied to the conventional semiconductor light emitting device 110, the current is passed through the Zener diode and so the current is passed through the semiconductor light emitting device 110 in reverse direction. On the other hand, as shown in FIG. 4B, when a reverse direction voltage Vrd is applied to the green LED chip 25 and the protection circuit 17 in the semiconductor light emitting device of the present invention, the current is not passed through the protection circuit 17 in reverse direction since the forward direction Zener diode 17a is disposed in the protection circuit 17.

In addition, as shown in FIG. 4B, when a voltage higher than the breakdown voltage Vfb of the protection circuit is applied in forward direction to the green LED chip 25. and the protection circuit 17, the protection circuit breaks down and the current is passed through the protection circuit, which prevents high voltage applied to the LED, and consequently prevents the LED from being damaged. When a voltage higher than the breakdown voltage Vfb of the protection circuit is applied in reverse direction to the green LED chip 25 and the protection circuit 17, the protection circuit also breaks down and the current is passed through the protection circuit, which prevents high voltage applied to the LED, and as a result prevents the LED from being damaged either.

Figure 5:
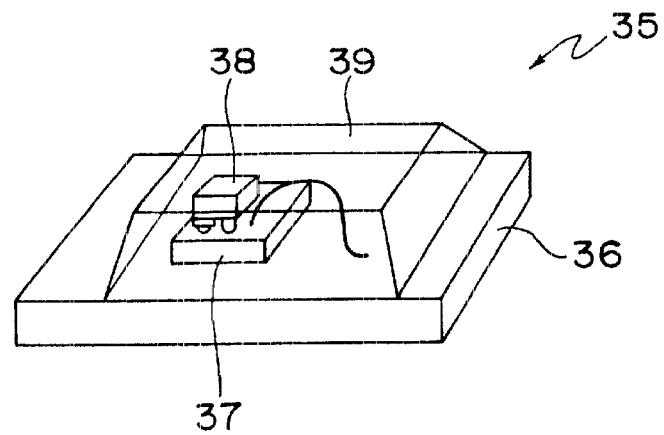
FIG. 5 is a perspective view of a semiconductor light emitting device in an embodiment of the present invention.

FIG. 5 is a view showing a semiconductor light emitting device in another embodiment of the present invention. The semiconductor light emitting device 35 is composed of a substrate 36, a silicon chip 37 having a protection circuit and a voltage compensating diode which is mounted on the substrate 36, a LED chip 38 mounted on the silicon chip 37, and resin 39 for sealing the silicon chip 37 and the LED chip 38 to form a chip-shaped semiconductor light emitting device 35.

Figure 6:
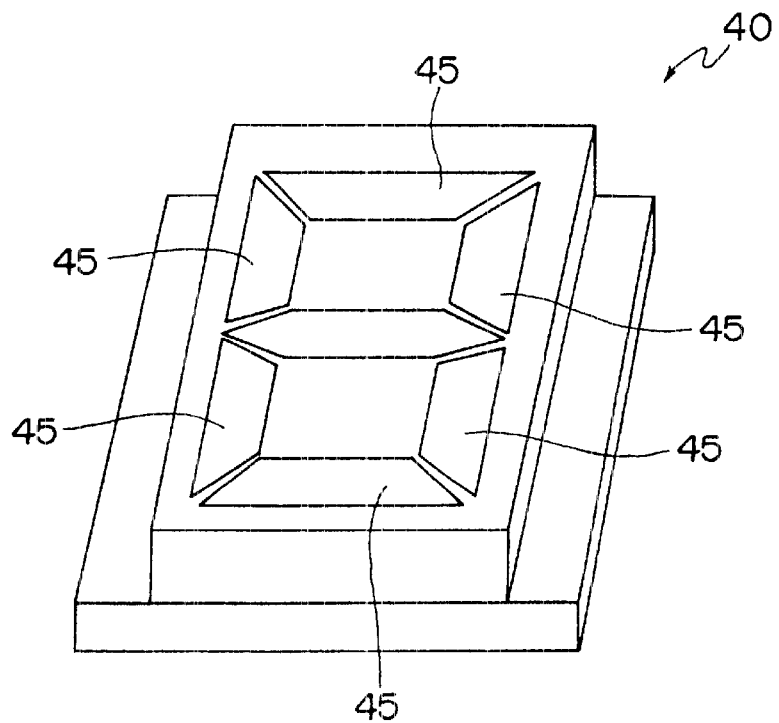
FIG. 6 is a view of a numerical display device using the semiconductor light emitting device of the present invention.

FIG. 6 is a view showing a segment-shaped numerical display device using the semiconductor light emitting device of the present invention. The numerical display device 40 having a segment shape is composed of seven segments 45, each of which incorporates a silicon chip having a protection circuit and a voltage compensating diode formed thereof and a LED chip.

Figure 7:
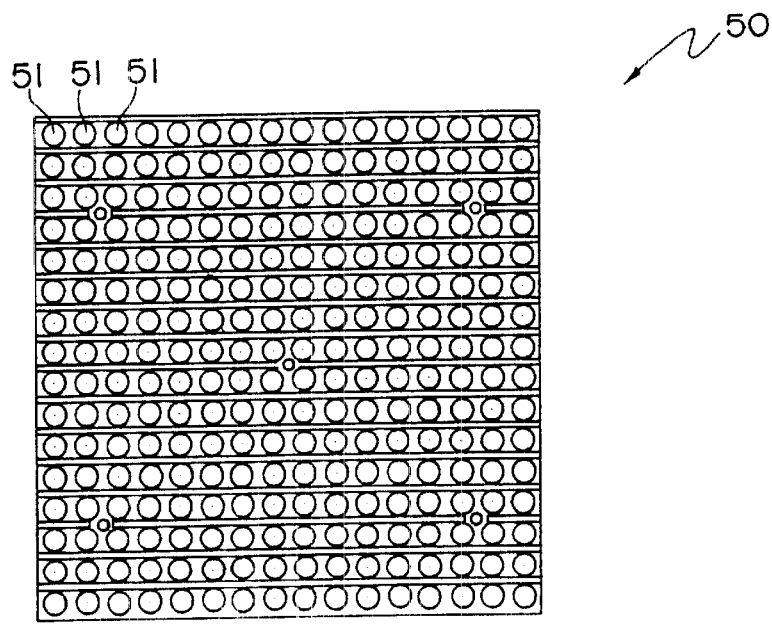
FIG. 7 is a front view of a dynamic driving display device using the semiconductor light emitting devices of the present invention.
Figure 8:
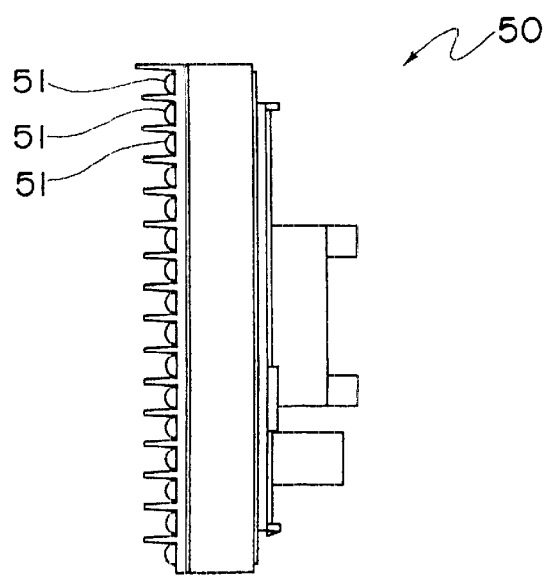
FIG. 8 is a side view of the dynamic driving display device shown in FIG. 7.
Figure 12:
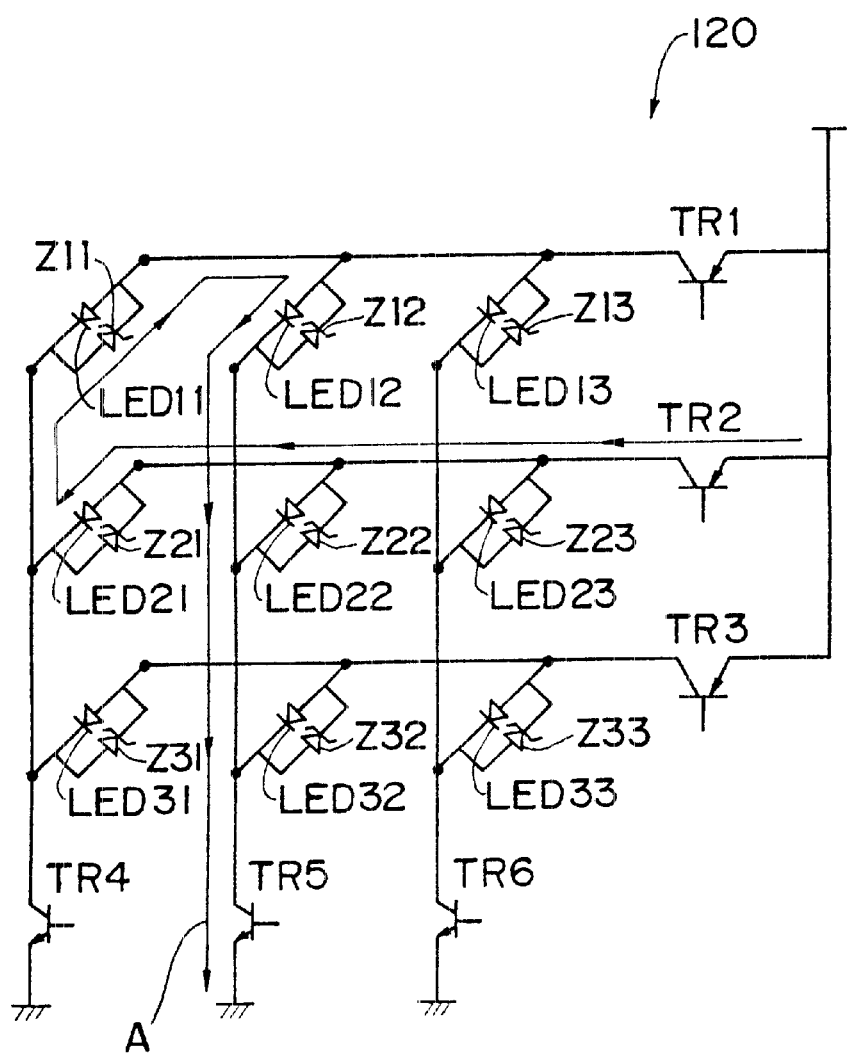
FIG. 12 is a circuit diagram of a display device using the conventional semiconductor light emitting device shown in FIG. 11.

FIG. 7 is a front view showing a dynamic driving display device composed of the semiconductor light emitting devices of the present invention connected in the form of matrix. FIG. 8 is a side view of the same. The display device 50 includes LEDs 51, each of which has a protection circuit connected in parallel to the LED 51 as in the case with the protection circuits 17 and 18 shown in FIG. 3. This protection circuit also has two Zener diodes series-connected in opposite directions to each other. Therefore, when a voltage below the breakdown voltage is applied in forward direction or in reverse direction, the protection circuit is turned off and the current is not passed through the protection circuit. Consequently, the display device 50 is free from a leakage current as shown in FIG. 12 describing the prior art, and therefore the display device 50 is proof against indication errors.

Figure 9:
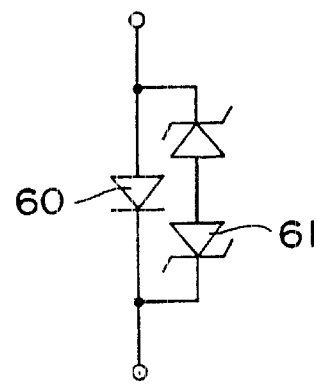
FIG. 9 is a circuit diagram showing that a Zener diode incorporated in the semiconductor light emitting device of the present invention is connected in a cathode common state.
Figure 10:
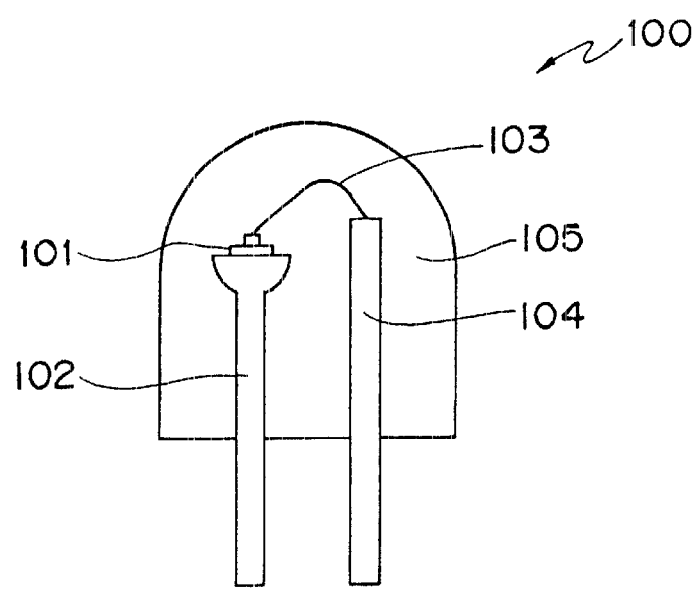
FIG. 10 is a sectional view of a conventional semiconductor light emitting device.

Although the semiconductor light emitting device in the above-stated embodiment is connected in an anode common state as shown in FIG. 3, the semiconductor light emitting device may be connected in a cathode common state as shown in FIG. 9. Connection in the anode common state or in the cathode common state can be set by wiring on the silicon chip having the protection circuit and the voltage compensating diode formed thereon. Accordingly, the polarity of LEDs to be used in the semiconductor light emitting device does not have to be limited.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A semiconductor light emitting device comprising: a first LED; a second LED having a forward direction threshold voltage lower than that of the first LED, the second LED being connected in parallel with the first LED; and a protection circuit comprising Zener diodes connected in series in opposite directions to each other, the protection circuit being connected in parallel with the first LED.

2. The semiconductor light emitting device according to claim 1, wherein the first LED is made from a nitride compound semiconductor.

3. The semiconductor light emitting device according to claim 1,
wherein the protection circuit is formed in one silicon chip.

4. The semiconductor light emitting device according to claim 3,
wherein at least one LED is disposed on the silicon chip.

5. A semiconductor light emitting device comprising:
a first LED;
a second LED having a forward direction threshold voltage lower than that of the first LED, the second LED being connected in parallel with the first LED; and
at least one voltage compensating diode connected in series to the second LED, but not to the first LED, so that the first and second LEDs are caused to emit light using the same driving voltage.

6. The semiconductor light emitting device according to claim 5,
wherein the voltage compensating diode is formed in one silicon chip.

7. The semiconductor light emitting device according to claim 1, wherein at least one voltage compensating diode is connected in series to the second LED, but not the first LED so that the first and second LEDs are caused to emit light using the same driving voltage.

8. A semiconductor light emitting device, comprising:
a first LED emitting at least one of blue light and green light;
a protection circuit comprising Zener diodes connected in series in opposite directions to each other; and
a red light emitting circuit comprising: a second LED emitting a red light, and at least one voltage compensating diode connected in series to the second LED,
wherein the first LED, the protection circuit and the red light emitting circuit are connected in parallel so that leakage current does not flow through the LEDs when arranged in matrix form.

9. The semiconductor light emitting device according to claim 8,
wherein the voltage compensating diode and the protection circuit are formed in one silicon chip.

10. The semiconductor light emitting device according to claim 1,
wherein the Zener diodes are connected in an anode common state or a cathode common state.

11. The semiconductor light emitting device according to claim 8,
wherein the Zener diodes are connected in an anode common state or a cathode common state.

12. A dynamic driving display device using the semiconductor light emitting device according to claim 1.

13. A dynamic driving display device using the semiconductor light emitting device according to claim 5.

14. A dynamic driving display device using the semiconductor light emitting device according to claim 8.

15. The semiconductor light emitting device according to claim 1, wherein at least one voltage compensating diode is connected in series to the second LED, but not to the first LED, in order to cause an apparent forward direction threshold voltage of the second LED to be the same as the forward direction threshold voltage of the first LED.

16. The semiconductor light emitting device according to claim 5, wherein the at least one voltage compensating diode causes an apparent forward direction threshold voltage of the second LED to be the same as the forward direction threshold voltage of the first LED.

17. The semiconductor light emitting device according to claim 8, wherein the at least one voltage compensating diode causes an apparent forward direction threshold voltage of the red LED to be the same as the forward direction threshold voltage of the first LED.

18. The semiconductor light emitting device according to claim 7, wherein the first and second LEDs are turned on to emit light independent of each other.

19. The semiconductor light emitting device according to claim 5, wherein the first and second LEDs are turned on to emit light independent of each other.

20. The semiconductor light emitting device according to claim 8, wherein the first and second LEDs are turned on to emit light independent of each other.

21. (New) A display device comprising a plurality of the semiconductor light emitting devices according to claim 1, wherein the semiconductor light emitting devices are connected to one another in a form of matrix.

22. A display device comprising a plurality of the semiconductor light emitting devices according to claim 8, wherein the semiconductor light emitting devices are connected to one another in a form of matrix.

23. The semiconductor light emitting device according to claim 5, further comprising a protection circuit comprising Zener diodes connected in series in opposite directions to each other, the protection circuit being connected in parallel with the first LED, wherein the protection circuit and the voltage compensation diode are formed in one silicon chip.

24. The semiconductor light emitting device according to claim 7, wherein the protection circuit and the voltage compensation diode are formed in one silicon chip.

25. A semiconductor light emitting device, comprising:
- a first LED;
- a protection circuit comprising Zener diodes connected in series in opposite directions to each other, wherein the first LED and the protection circuit are connected in parallel;
- another LED having a lower forward direction threshold voltage than the first LED, and at least one voltage compensating diode connected in series to the another LED having the lower forward direction threshold voltage; and
- wherein each of the first and the another LEDs can be turned on to emit light, without the other of the LEDs being turned on to emit light.

26. A display device comprising a plurality of the semiconductor light emitting devices according to claim 5, wherein the semiconductor light emitting devices are connected to one another in a form of matrix.

* * * * *